(12) United States Patent
Wada

(10) Patent No.: US 10,211,337 B2
(45) Date of Patent: Feb. 19, 2019

(54) SEMICONDUCTOR DEVICE

(71) Applicant: Hitachi Automotive Systems, Ltd., Hitachinaka-shi, Ibaraki (JP)

(72) Inventor: Shinichirou Wada, Tokyo (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 360 days.

(21) Appl. No.: 15/034,286

(22) PCT Filed: Oct. 22, 2014

(86) PCT No.: PCT/JP2014/078012
§ 371 (c)(1),
(2) Date: May 4, 2016

(87) PCT Pub. No.: WO2015/072295
PCT Pub. Date: May 21, 2015

(65) Prior Publication Data
US 2016/0276477 A1 Sep. 22, 2016

(30) Foreign Application Priority Data

Nov. 12, 2013 (JP) .................................. 2013-233622

(51) Int. Cl.
*H01L 29/78* (2006.01)
*H01L 21/76* (2006.01)
(Continued)

(52) U.S. Cl.
CPC .......... *H01L 29/7826* (2013.01); *H01L 21/76* (2013.01); *H01L 27/1203* (2013.01);
(Continued)

(58) Field of Classification Search
CPC ............ H01L 29/7819; H01L 29/7826; H01L 29/402; H01L 29/1095; H01L 29/0886;
(Continued)

(56) References Cited

U.S. PATENT DOCUMENTS 6,441,432 B1   8/2002  Sumida
7,489,007 B2 * 2/2009  Williams ............. H01L 21/761
                                                           257/335
(Continued)

FOREIGN PATENT DOCUMENTS

JP   10-154812 A   6/1998
JP   10-200102 A   7/1998
(Continued)

OTHER PUBLICATIONS

European Search Report issued in counterpart European Application No. 14862551.0 dated May 8, 2017 (nine pages).
(Continued)

*Primary Examiner* — William F Kraig
*Assistant Examiner* — Sun Mi Kim King
(74) *Attorney, Agent, or Firm* — Crowell & Moring LLP

(57) ABSTRACT

To provide a high-withstand-voltage lateral semiconductor device in which ON-resistance or drain current density is uniform at an end portion and a center portion of the device in a gate width direction. A lateral N-type MOS transistor 11 formed on an SOI substrate includes a trench isolation structure 10*b* filled with an insulating film at an end portion of the transistor. An anode region 6 of a diode 12 is provided adjacent to a P-type body region 1 of the transistor through the trench isolation structure 10*b* and a cathode region 15 of the diode 12 is also provided adjacent to an N-type drain-drift region 4 of the transistor through the trench isolation structure 10*b* so as to cause electric field to be applied to the trench isolation structure 10*b* to be zero when a voltage is applied across the transistor.

8 Claims, 8 Drawing Sheets

(51) Int. Cl.
*H01L 29/861* (2006.01)
*H01L 29/868* (2006.01)
*H01L 27/12* (2006.01)
*H01L 29/06* (2006.01)
*H01L 29/786* (2006.01)
*H01L 29/08* (2006.01)
*H01L 29/10* (2006.01)
*H01L 29/40* (2006.01)

(52) U.S. Cl.
CPC ...... *H01L 29/0653* (2013.01); *H01L 29/0692* (2013.01); *H01L 29/0696* (2013.01); *H01L 29/086* (2013.01); *H01L 29/0869* (2013.01); *H01L 29/0878* (2013.01); *H01L 29/0886* (2013.01); *H01L 29/1083* (2013.01); *H01L 29/1095* (2013.01); *H01L 29/402* (2013.01); *H01L 29/7819* (2013.01); *H01L 29/7824* (2013.01); *H01L 29/7835* (2013.01); *H01L 29/78624* (2013.01); *H01L 29/861* (2013.01); *H01L 29/868* (2013.01)

(58) Field of Classification Search
CPC ............. H01L 29/1083; H01L 29/0696; H01L 29/0869; H01L 29/78624; H01L 29/7835; H01L 29/0653; H01L 29/0692; H01L 29/861; H01L 29/868; H01L 21/76
See application file for complete search history.

(56) References Cited

U.S. PATENT DOCUMENTS

| 2002/0053717 A1 | 5/2002 | Sumida |
| 2002/0195640 A1 | 12/2002 | Kameda |
| 2008/0203533 A1 | 8/2008 | Kaneko et al. |
| 2011/0298446 A1 | 12/2011 | Shiraki et al. |
| 2012/0261752 A1 | 10/2012 | Lee et al. |

FOREIGN PATENT DOCUMENTS

| JP | 2003-7843 A | 1/2003 |
| JP | 3473460 B2 | 12/2003 |
| JP | 2007-96143 A | 4/2007 |
| JP | 2008-235856 A | 10/2008 |
| JP | 2009-54757 A | 3/2009 |
| JP | 2010-186878 A | 8/2010 |
| JP | 2011-61051 A | 3/2011 |
| JP | 2013-89781 A | 5/2013 |
| WO | WO 2011/030597 A1 | 3/2011 |

OTHER PUBLICATIONS

International Search Report (PCT/ISA/210) issued in PCT Application No. PCT/JP2014/078012 dated Feb. 3, 2015, with English translation (four (4) pages).
European Office Action issued in counterpart European Application No. 14862551.0 dated Feb. 1, 2018 (Seven (7) pages).

\* cited by examiner

CROSS-SECTIONAL VIEW TAKEN ALONG LINE A-A'

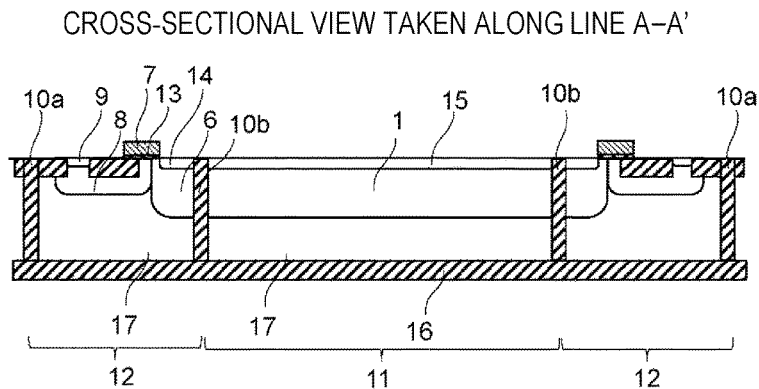

FIG. 2A

CROSS-SECTIONAL VIEW TAKEN ALONG LINE B-B'

CROSS-SECTIONAL VIEW TAKEN ALONG LINE C-C'

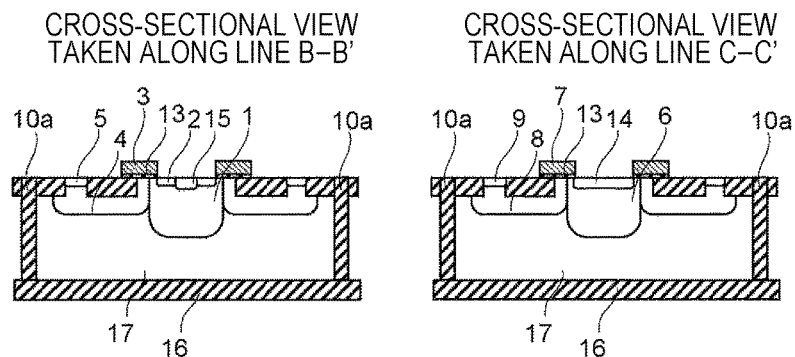

FIG. 2B

1 P-TYPE BODY REGION
2 N-TYPE SOURCE REGION
3 GATE ELECTRODE
4 N-TYPE DRAIN-DRIFT REGION
5 N+ DRAIN REGION
6 P-TYPE ANODE REGION
7 DIODE FIELD PLATE ELECTRODE
8 N-TYPE CATHODE REGION
9 N+ CATHODE CONTACT DIFFUSION REGION
10a TRENCH ISOLATION STRUCTURE TO BE INSULATED FROM EXTERNAL SUBSTRATE
10b TRENCH ISOLATION STRUCTURE SEPARATING MOS TRANSISTOR FROM DIODE

11 MOS TRANSISTOR REGION
12 DIODE REGION
13 INSULATING FILM
14 P+ ANODE CONTACT DIFFUSION REGION
15 P+ BODY CONTACT DIFFUSION REGION
16 BURIED OXIDE FILM
17 SEMICONDUCTOR LAYER

FIG. 2C

CROSS-SECTIONAL VIEW TAKEN ALONG LINE A-A'

FIG. 6A

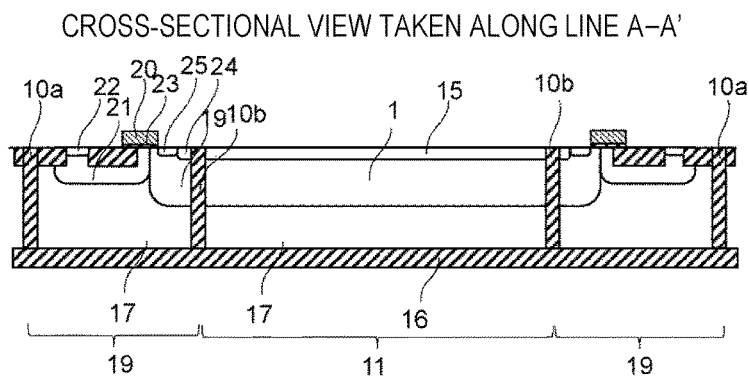

CROSS-SECTIONAL VIEW TAKEN ALONG LINE B-B'

FIG. 6B

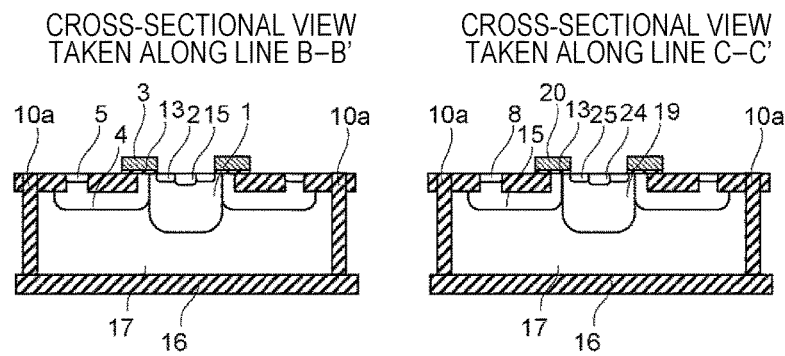

CROSS-SECTIONAL VIEW TAKEN ALONG LINE C-C'

FIG. 6C

18 DUMMY MOS TRANSISTOR REGION
19 P-TYPE BODY REGION OF DUMMY MOS TRANSISTOR
20 GATE ELECTRODE OF DUMMY MOS TRANSISTOR
21 N-TYPE DRAIN REGION OF DUMMY MOS TRANSISTOR
22 N+ DRAIN REGION OF DUMMY MOS TRANSISTOR
23 GATE OXIDE FILM OF DUMMY MOS TRANSISTOR
24 P+ BODY CONTACT DIFFUSION REGION OF DUMMY MOS TRANSISTOR
25 N+ SOURCE REGION OF DUMMY MOS TRANSISTOR (CONVENTIONAL STRUCTURE)

1 P-TYPE BODY REGION
2 N+ SOURCE REGION
3 GATE ELECTRODE
4 N-TYPE DRAIN-DRIFT REGION
5 N+ DRAIN REGION

10 TRENCH ISOLATION STRUCTURE
26 P+ DIFFUSION REGION (CONVENTIONAL STRUCTURE)

1 P-TYPE BODY REGION
2 N+ SOURCE REGION
3 GATE ELECTRODE
4 N-TYPE DRAIN-DRIFT REGION
5 N+ DRAIN REGION

10 TRENCH ISOLATION STRUCTURE

SEMICONDUCTOR DEVICE

TECHNICAL FIELD

The present invention relates to a semiconductor device, and relates to a lateral semiconductor device formed on a semiconductor substrate.

BACKGROUND ART

In a high-withstand-voltage lateral transistor, improvement of a layout for a plane-shaped device end portion has been conventionally performed in order to improve an ON-withstand voltage of the transistor. Here, two examples will be given and described below based on plane layout drawings in FIGS. 7 and 8.

According to a first conventional example, as illustrated in FIG. 7, a P-type body region 1 envelops an N+ drain region 5 and an N-type drain-drift region 4 in a lateral NMOS transistor. A gate electrode 3 is formed so as to overlap with an end portion of the P-type body region 1. Furthermore, a semicircular and plane-shaped end portion of the P-type body region 1 has a part at which the date electrode 3 and an N+ source region 2 are not adjacent to each other. With this structure, since an end portion of the device has no source region 2, current density can be reduced at an end portion of the drain region 5, and thus a problem that the drain current density increases at the end portion and a Kirk effect degrades an ON-withstand voltage, can be solved.

According to a second conventional example, as illustrated in FIG. 8, an N+ drain region 5 and an N-type drain-drift region 4 envelop an N+ source region 2 and a P-type body region 1 in a lateral NMOS transistor. A gate electrode 3 is formed so as to overlap with an end portion of the P-type body region 1. Furthermore, a semicircular and plane-shaped end of the P-type body region 1 has a part at which the gate electrode 3 and the N+ source region 2 are not adjacent to each other. This structure includes the N+ drain region provided on the outer circumference with respect to the N+ source region in comparison to the conventional example 1. Thus, the radius of curvature of the drain-drift region increases and drain current density at a further end portion can be reduced. Accordingly, improvement of an ON-withstand voltage can be further expected in comparison to the first conventional example.

CITATION LIST

Patent Literatures

Patent Literature 1: JP 3473460 B2
Patent Literature 2: JP 2007-96143 A

SUMMARY OF INVENTION

Technical Problem

However although the ON-withstand voltage can be improved, each of the transistors according to the conventional examples has the following problems.

First, ON-resistance or a drain current characteristic at the end portion of the transistor is different from ON-resistance or a drain current characteristic at the center portion, respectively. Each case of the structures according to the conventional examples includes the N+ drain region 5 and the N-type drain region 4 also formed at the end portion and includes no N+ source region 2 provided at the end portion. Accordingly, drain resistance determined based on diffusion resistance of the N-type drain-drift region and diffusion resistance of the N+ drain region, becomes smaller at the end portion than at the center portion. As a result, the reciprocal of ON-resistance Ron or a drain current Ids does not become linear with respect to a gate width Wg, has an offset ΔWg, and is expressed by the following expression.

$$\frac{1}{Ron} \propto Ids \propto W_g + \Delta W_g$$

Accordingly, a ratio of the offset ΔWg occupying increases in a transistor having a small gate width Wg. Accordingly, for example, in a case where the transistor is used in a current detecting (sense) circuit, a sense ratio deviates from a ratio of the gate width Wg of the transistor due to this offset. Due to the influence of the offset, a transistor having large ON-resistance and a small drain current cannot be achieved. Thus, it is difficult to constitute a current detecting circuit having a large sense ratio.

Secondly, a variation of the ON-resistance at the end portion due to a variation in temperature is different from a variation at the center portion. The ON-resistance of the high-withstand-voltage lateral MOS transistor is mainly given by the sum of channel resistance RCH and drain-drift resistance RDRIFT, and is given by the following expression.

$$Ron(Tj) = R_{CH}(Tj) + R_{DRIFT}(Tj)$$

Here, the channel resistance RCH and the drain-drift resistance RDRIFT each have temperature Tj dependence. However, a temperature coefficient of the channel resistance RCH and a temperature coefficient of the drain-drift resistance RDRIFT are different from each other. As described above, since the drain-drift resistance RDRIFT becomes smaller at the device end portion than at the center portion, a ratio of the drain-drift resistance occupying in the ON-resistance varies depending on the gate width Wg. As a result, a problem that temperature dependence of the ON-resistance varies depending on the gate width Wg of the transistor, occurs.

Meanwhile, in a case where the transistor is used in a current detecting (sense) circuit, a sense ratio is given by a current amount ratio between the sense circuit and a primary (main) circuit, namely, an inverse ratio of the ON-resistance, and is given by the following expression.

$$\text{Sense Ratio}(Tj) = \frac{Ids_{Main}(Tj)}{Ids_{Sence}(Tj)} = \frac{Ron_{Sence}(Tj)}{Ron_{Main}(Tj)}$$

Accordingly, in a case where transistors each having a different gate width are used in a sense circuit and a main circuit, since the temperature coefficients of the pieces of ON-resistance or drain currents of the transistors, are different from each other, a problem that a sense ratio varies depending on temperature, occurs.

The present invention provides a lateral semiconductor device having a high-withstand-voltage lateral MOS transistor structure capable of improving the above two problems.

Solution to Problem

An object of the present invention is to equalize an ON-resistance characteristic or a drain current characteristic at a device end portion with that at a device center portion in a high-withstand-voltage lateral device. Accordingly, the current characteristic of the device can be made to be linear with respect to a width of the device, and the problems that have been described above can be solved.

A lateral MOS transistor according to the present invention, includes: a first conductive body region formed in the semiconductor substrate layer; a second conductive drain-drift region adjacent to or apart from, and entirely enveloping the body region; a second conductive drain region in contact with the drain-drift region; a second conductive source region formed in the body region; an insulating film covering an upper side of the drain-drift region from an end of the source region; a gate electrode covering the upper side of the drain-drift region from an upper end of the source region through the insulating film; trench isolation structure provided and including an insulating film adjacent to an end portion of the body region and an end portion of the drain-drift region; and a diode including: a first conductive anode region adjacent to the trench isolation structure; a second conductive cathode region adjacent to the trench isolation structure; an insulating film covering an upper side of the cathode region from an end of the anode region; and a diode field plate electrode covering the upper side of the cathode region from an upper side of the anode region through the insulating film. The anode region and the cathode region of the diode have impurity profiles equal to those of the body region and the drain region, respectively. In addition, a distance between a diffusion region coupling the anode region and a diffusion region coupling the cathode region; is equal to a distance between the source region and the drain region at least at a portion in contact with the trench. The anode region is electrically coupled to the body region at the same electric potential through a wiring layer. The cathode region is electrically coupled to the drain region through a wiring layer. The gate electrode is electrically coupled to the diode field plate electrode.

Another lateral MOS transistor according to the present invention, is a lateral semiconductor device formed on a semiconductor substrate, and includes: a first conductive body region formed in the semiconductor substrate layer; a second conductive drain-drift region adjacent to or apart from, and entirely enveloping the body region; a second conductive drain region in contact with the drain-drift region; a second conductive source region formed in the body region; an insulating film covering an upper side of the drain-drift region from an end of the source region; a gate electrode covering the upper side of the drain-drift region from an upper end of the source region through the insulating film; a trench isolation structure provided and including an insulating film adjacent to an end portion of the body region and an end portion of the drain-drift region; and a dummy MOS transistor including: a first conductive second body region adjacent to the trench isolation structure; a second conductive second drain-drift region adjacent to the trench isolation structure; a second conductive second drain region in contact with the drain-drift region; a second conductive second source region formed in the body region; a second insulating film covering an upper side of the second drain-drift region from an end of the second source region; and a second gate electrode covering the upper side of the second drain-drift region from an upper side of the second source region through the second insulating film. The second body region and the second drain-drift region of the dummy MOS transistor have impurity profiles equal to those of the body region and the drain-drift region of the MOS transistor, respectively. In addition, a distance between the second source region and the second drain region of the dummy MOS transistor is equal to a distance between the source region and the drain region of the MOS transistor at least at a portion in contact with the trench isolation structure. A source electrode and a drain electrode of the dummy MOS transistor are electrically coupled to a source electrode and a drain electrode of a MOS transistor through a wiring layer, respectively. In addition, a gate electrode of the dummy MOS transistor is electrically coupled to a source electrode.

Advantageous Effects of Invention

According to the present invention, in a high-withstand-voltage lateral semiconductor device, a trench isolation structure is provided at an end portion of a body region and an end portion of a drain-drift region at a device end portion. In addition, a diode is formed adjacent to the trench isolation structure. Furthermore, the diode and a MOS transistor adjacent to the trench isolation structure have the same structure, such as an impurity profile and a size. In addition, terminals between the diode and the MOS transistor are electrically coupled. Accordingly, pieces of electric field potential of semiconductor regions in a case where a voltage is applied across individual terminals of the device, can be equal to each other through the trench isolation structure. In other words, a voltage to be applied to the trench isolation structure can be made to be zero. Accordingly, the pieces of electric field potential at the device end portion are prevented from being influenced by the trench isolation structure, and an OFF-withstand voltage does rot degrade. Since a drain-drift region at an end portion that cannot be separated in a conventional structure, can be omitted, a drain current characteristic at the end portion can be made to be equal to that at a center portion. As a result, linearity of ON-resistance or a drain current of the transistor with respect to a gate width, can be improved.

Since the drain current characteristic at the end portion can be made to be equal to that at the center portion, temperature characteristic of the ON-resistance can be made to be constant regardless of the gate width. As a result, a variation of a sense ratio in temperature can be eliminated in a current detecting (sense) circuit having a gate width different from that of a primary (main) circuit.

Since drain, current density at the device end portion can be made to be equal to that at the center portion, it is effective for a conventional problem that drain current density at an end portion becomes larger than that at a center portion and an voltage degrades.

BRIEF DESCRIPTION OF DRAWINGS

FIG. 2A is a longitudinal sectional view of a region taken along line A-A' of FIG. 1.

FIG. 2B is a longitudinal sectional view of a region taken along line B-B' of FIG. 1.

FIG. 2C is a longitudinal sectional view of a region taken along line C-C' of FIG. 1.

FIG. 6A is a longitudinal sectional view of a region taken along line A-A' of FIG. 5.

FIG. 6B is a longitudinal sectional view of a region taken along line B-B' of FIG. 5.

FIG. 6C is a longitudinal sectional view of a region taken along line C-C' of FIG. 5.

DESCRIPTION OF EMBODIMENTS

Embodiments of the present invention will be described below based on the drawings. Note that, although a semiconductor device has been formed on a silicon on insulator (SOI) substrate in the present embodiments, the semiconductor device may be formed on an Si substrate. In addition, although a case of an NMOS transistor has been described in the present embodiments, a PMOS transistor may be applied.

First Embodiment

Figure 1:
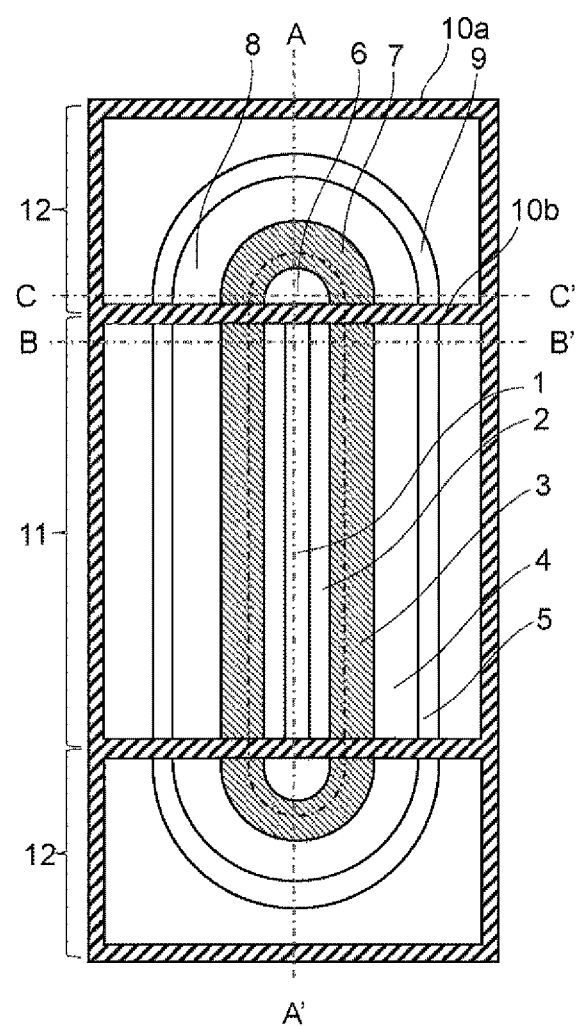
FIG. 1 is a plan view of a main portion of a high-withstand-voltage NMOS transistor according to a first embodiment of the present invention.

A first embodiment of the present invention will be described based on FIGS. 1 and 2. FIG. 1 is a plan view for describing the first embodiment. FIGS. 2(a), 2(b), and 2(c) are cross-sectional views taken along line A-A', line B-B', and line C-C' of FIG. 1, respectively.

As illustrated in FIGS. 1 and 2, a MOS transistor region 11, a trench isolation structure 10b, and a diode region 12 are provided on an SOI substrate including a buried oxide film 16 and a semiconductor layer 17. The MOS transistor region 11 includes: a P-type body region 1; an N-type drain-drift region 4 adjacent to the P-type body region 1; an N+ drain region 5 in contact with the N-type drain-drift region 4; a source region 2 formed in the P-type body region; an insulating film 13 covering the upper side of the drain-drift region 4 from an end of the source region 2; and a gate electrode 3 covering the upper side of the drain-drift region 4 from the upper end of the source region 2 through the insulating film 13. The trench isolation structure 10b includes an insulating film adjacent to an end portion of the P-type body region 1 and an end portion of the drain-drift region 4. The diode region 12 includes: a P-type anode region 6 adjacent to the trench isolation structure 10b; an N-type cathode region 8 adjacent to the trench isolation structure 10b; the insulating film 13 covering the upper side of the N-type cathode region 8 from an end of the P-type anode region 6; a diode field plate electrode 7 covering the upper side of the N-type cathode region 8 from the upper side of the P-type anode region 6 through the insulating film 13. A cross-sectional structure of the MOS transistor region illustrated in FIG. 2(b) and a cross-sectional structure of the diode region illustrated in FIG. 2(c) are identical to each other at least at a portion in contact with the trench isolation structure 10b except the N-type source region 2, a P+ body contact diffusion region 15, and a P+ anode contact diffusion region 15. The N+ drain region 5 and an N+ cathode contact diffusion region 9 are electrically coupled to each other through a wiring layer. The P+ body contact diffusion region 15 and the P+ anode contact diffusion region 14 are electrically coupled to each other through a wiring layer. The gate electrode 3 is electrically coupled to the diode field plate electrode 7 through a wiring layer. The wiring layers are not illustrated in the figures. Accordingly, when a voltage is applied across the MOS transistor 11, pieces of electric field potential in the P-type body region 1 and the N-type drain-drift region 4 can be identical to pieces of electric field potential in the P-type anode region 6 and the N-type cathode region 8 of the diode 12, at least at a portion in proximity to the trench isolation structure 10b. Thus, electric field intensity to be applied to the trench isolation structure 10b becomes zero. Accordingly, electric field potential at an end portion of the MOS transistor 11 in proximity to the trench isolation structure 10b is not influenced by the trench isolation structure and becomes identical to electric field potential at a portion other than the end portion of the MOS transistor 11. As a result, a drain current characteristic at the end portion of the transistor becomes equal to a drain current characteristic at a portion other than the end portion. An ON-withstand voltage and an OFF-withstand voltage are prevented from degrading at the end portion of the MOS transistor 11.

Second Embodiment

Figure 3:
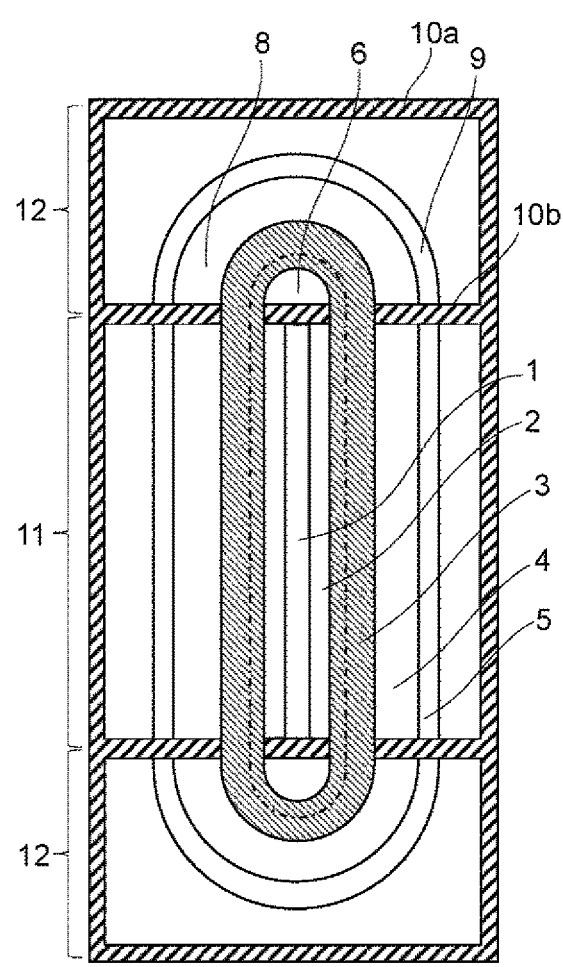
FIG. 3 is a plan view of a main portion of a high-withstand-voltage NMOS transistor according to a second embodiment of the present invention.

A second embodiment of the present invention will be described based on FIG. 3. A point different from the configuration in FIG. 1 is that while the gate electrode 3 of the MOS transistor 11 is coupled to drain field plate electrode 7 of the diode 12 through the wiring layer in FIG. 1, a gate electrode 3 is directly coupled to a drain field plate electrode in FIG. 3. Accordingly, an effect similar to the effect that has been described in the first embodiment, is acquired.

Third Embodiment

Figure 4:
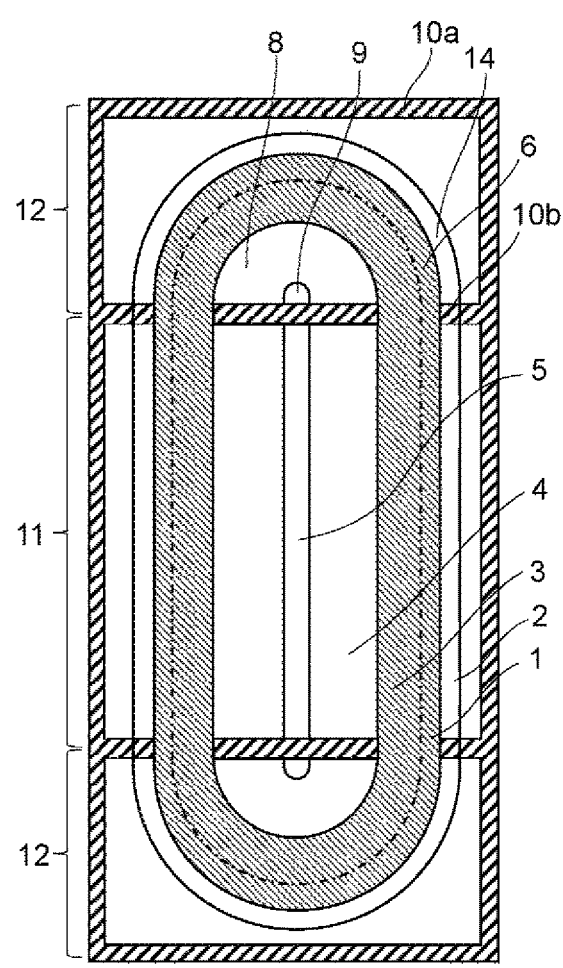
FIG. 4 is a plan view of a main portion of a high-withstand-voltage NMOS transistor according to a third embodiment of the present invention.

A third embodiment of the present invention will be described based on FIG. 4. A point different from the configuration in FIG. 3 is that a gate electrode 3 and an N-type source region 2 are provided around an N+ drain region 5 and an N-type drain-drift region 4 in a MOS transistor 11 and, in response to that, a P+ anode contact diffusion region is provided around an N-type cathode region 8 of a diode 12. Accordingly, as described in the first embodiment, electric field intensity to be applied to the trench isolation structure 10b becomes zero when a voltage is applied across the transistor, and a similar effect can be acquired.

Fourth Embodiment

Figure 5:
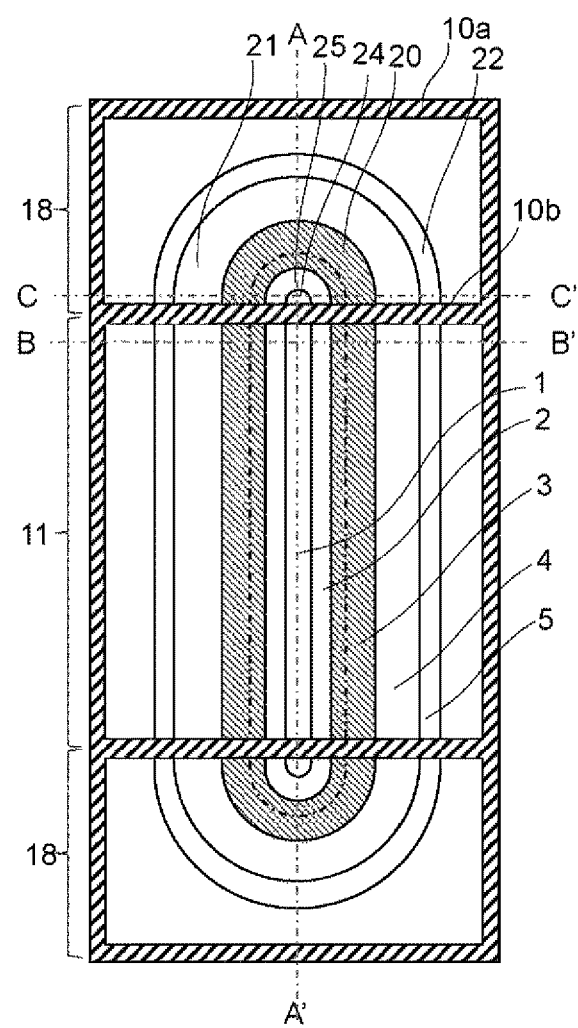
FIG. 5 is a plan view of a main portion of a high-withstand-voltage NMOS transistor according to a fourth embodiment of the present invention.
Figure 7:
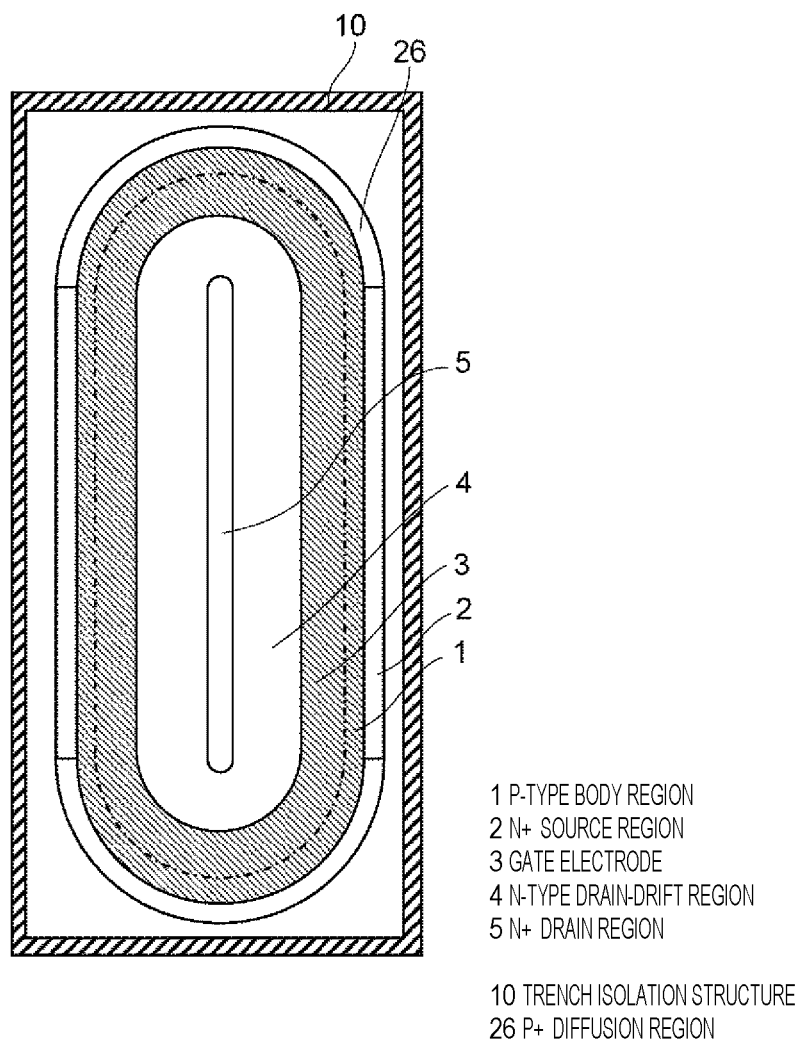
FIG. 7 is a plan view of a main portion of a first conventional high-withstand-voltage NMOS transistor.
Figure 8:
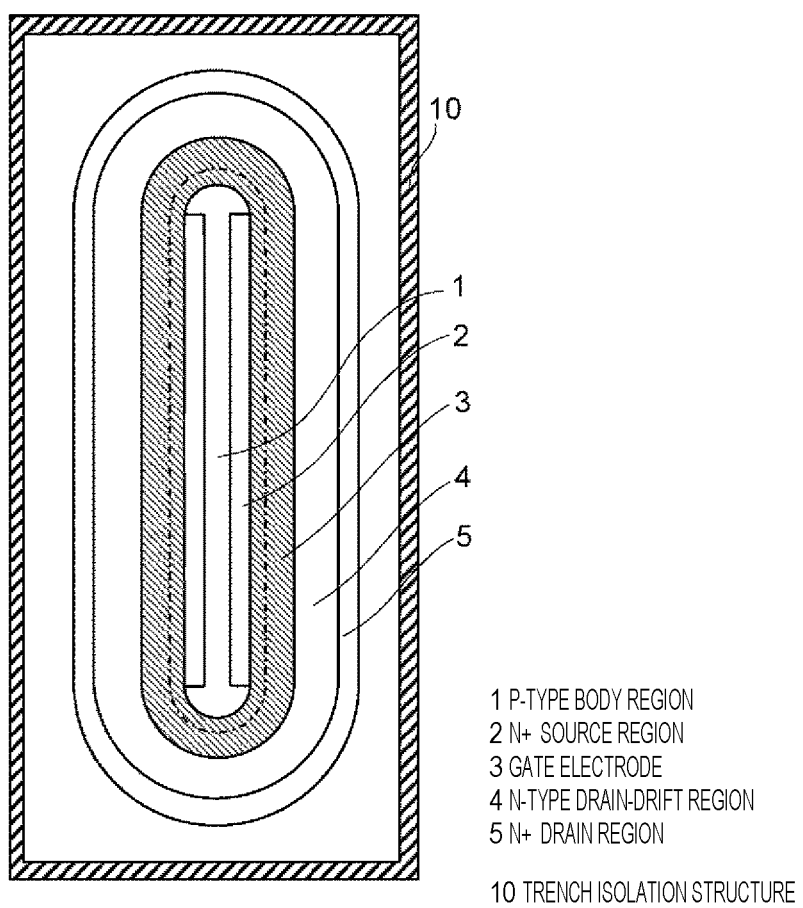
FIG. 8 is a plan view of a main portion of a second conventional high-withstand-voltage NMOS transistor.

A fourth embodiment of the present invention will be described based on FIGS. 5 and 6. A point different from the configuration in FIG. 1 is that a dummy MOS transistor 18 is provided adjacent to a trench isolation structure 10b instead of the diode 12. A cross-sectional structure of a MOS transistor 11 in FIG. 6(b) and a cross-sectional structure of the dummy MOS transistor 18 in FIG. 6(c) are identical to each other at least at a portion in proximity to the trench isolation structure 10b. An N+ drain region 5 and an N+ drain region 22 of the dummy MOS transistor 18 are electrically coupled to each other through a wiring layer. A P+ body contact diffusion region 15, a P+ body contact diffusion region 24 of the dummy MOS transistor 18, and a gate electrode 20 of the dummy MOS transistor 18 are electrically coupled to each other through a wiring layer. The wiring layers are not illustrated. Accordingly, when a voltage is applied across the MOS transistor 11, pieces of electric field potential in a P-type body region 1 and an N-type drain-drift region 4 can be identical to pieces of electric field potential in the dummy MOS transistor, at least at a portion in proximity to the trench isolation structure 10b. Thus, electric field intensity to be applied to the trench isolation structure 10b becomes zero. Accordingly, the effect that has been described in the first embodiment, is acquired.

REFERENCE SIGNS LIST

1 P-type body region
2 N-type source region
3 gate electrode
4 N-type drain-drift region
5 N-type drain region
6 P-type anode region
7 diode field plate region
8 N-type cathode region
9 N+ cathode contact diffusion region
10a trench isolation structure to be insulated from external substrate
10b trench isolation structure separating MOS transistor from diode
11 MOS transistor region
12 diode region
13 insulating film
14 P+ anode contact diffusion region
15 P+ body contact diffusion region
16 buried oxide film
17 semiconductor layer
18 dummy MOS transistor region
19 P-type body region of dummy MOS transistor
20 gate electrode of dummy MOS transistor
21 N-type drain region of dummy MOS transistor
22 N+ drain region of dummy MOS transistor
23 gate oxide film of dummy MOS transistor
24 P+ body contact diffusion region of dummy MOS transistor
25 N+ source region of dummy MOS transistor
26 P+ diffusion region

The invention claimed is:

1. A lateral semiconductor device formed on a semiconductor substrate and used for a sense circuit for current detection, comprising:
a first conductive first region formed in the semiconductor substrate layer;
a second conductive first region adjacent to or apart from, and enveloping the first conductive first region;
a trench isolation structure film adjacent to an end portion of the first conductive first region and the second conductive first region, and including an insulating film;
a first conductive second region adjacent to the trench isolation structure;
a second conductive second region adjacent to the trench isolation structure;
an anode region;
a body region;
a cathode region;
a drain-drift region;
a source region;
a gate electrode; and
a drain region, wherein
the first conductive first region and the first conductive second region each have the same impurity profile and the same region width at least at a region adjacent to the trench isolation structure,
the second conductive first region and the second conductive second region each have the same impurity profile and the same region width at least at a region adjacent to the trench isolation structure,
the first conductive first region and the second conductive first region are regions included in a transistor,
the anode region and the body region each have the same impurity profile,
the cathode region and the drain region each have the same impurity profile,
a distance between the source region and the drain region and a distance between a diffusion region coupling the anode region and a diffusion region coupling the cathode region, are equal to each other at least at a portion in proximity to the trench isolation structure, and
a distance of the gate electrode extending from the end of the source region to the upper side of the drain-drift region and a distance of a diode field plate electrode extending from an upper side of the anode region to the upper side of the cathode region, are equal to each other at least at a portion in proximity to the trench isolation structure.

2. The lateral semiconductor device according to claim 1, wherein
the anode region is electrically coupled to the body region,
the cathode region is electrically coupled to the drain region, and
the gate electrode is electrically coupled to the diode field plate electrode.

3. The lateral semiconductor device according to claim 1, further comprising a diode, wherein
the diode is formed so as to cause electric field intensity to be applied to the trench isolation structure to be zero when a voltage is applied across terminals of the lateral semiconductor device.

4. The lateral semiconductor device according to claim 1, further comprising:
a second drain-drift region;
a second source region, the lateral semiconductor device being formed on the semiconductor substrate;
a first conductive body region formed in the semiconductor substrate layer;
a second conductive drain-drift region adjacent to or apart from, and entirely enveloping the body region;
a second conductive drain region in contact with the drain-drift region;
a second conductive source region formed in the body region;
an insulating film covering an upper side of the drain-drift region from an end of the source region;
a gate electrode covering the upper side of the drain-drift region from an upper end of the source region through the insulating film;
a trench isolation structure provided and including an insulating film adjacent to an end portion of the body region and an end portion of the drain-drift region; and
a dummy MOS transistor including:
a first conductive second body region adjacent to the trench isolation structure;
a second conductive second drain-drift region adjacent to the trench isolation structure;
a second conductive second drain region in contact with the drain-drift region;
a second conductive second source region formed in the body region;

a second insulating film covering an upper side of the second drain-drift region from an end of the second conductive second source region; and a second gate electrode covering the upper side of the second drain-drift region from an upper side of the second conductive second source region through the second insulating film.

5. The lateral semiconductor device according to claim 4, wherein the body region and the first conductive second body region each have the same impurity profile, the drain-drift region and the second drain-drift region each have the same impurity profile, a distance between the source region and the second conductive drain region and a distance between the second conductive second source region and the second conductive second drain region, are equal to each other at least at a portion in proximity to the trench isolation structure.

6. The lateral semiconductor device according to claim 4, wherein the first conductive second body region is electrically coupled to the body region, the second conductive drain region is electrically coupled to the second conductive second drain region, and the second gate electrode is electrically coupled to a second source electrode.

7. The lateral semiconductor device according to claim 4, wherein the dummy MOS transistor is formed so as to cause electric field intensity to be applied to the trench isolation structure to be zero when voltage is applied across terminals of the lateral semiconductor device.

8. The lateral semiconductor device according to claim 1, the lateral semiconductor device being mounted on a current detecting (sense) circuit.

* * * * *